United States Patent [19]

Niimura et al.

[11] 4,292,597
[45] Sep. 29, 1981

[54] CIRCUIT FOR CONVERTING SINGLE-ENDED INPUT SIGNALS TO A PAIR OF DIFFERENTIAL OUTPUT SIGNALS

[75] Inventors: Tsutomu Niimura, Hiratsuka; Kyoichi Murakami, Chigasaki; Akira Yamakoshi, Tokyo, all of Japan

[73] Assignee: Sony Corporation, Tokyo, Japan

[21] Appl. No.: 83,858

[22] Filed: Oct. 11, 1979

[30] Foreign Application Priority Data

Oct. 13, 1978 [JP] Japan ............................. 53/126532
Oct. 13, 1978 [JP] Japan ......................... 53/141273[U]

[51] Int. Cl.$^3$ .......................... H03F 3/45; H03G 3/30
[52] U.S. Cl. ................................. 330/254; 330/257; 330/261; 330/288; 330/301
[58] Field of Search ............... 330/254, 257, 261, 288, 330/301

[56] References Cited

U.S. PATENT DOCUMENTS 3,932,768  1/1976  Takahashi et al. .............. 330/257 X
4,028,631  6/1977  Ahmed .................................. 330/296

Primary Examiner—James B. Mullins
Attorney, Agent, or Firm—Lewis H. Eslinger; Alvin Sinderbrand

[57] ABSTRACT

A circuit that is particularly adapted to convert a single-ended input signal to a pair of differential output signals. First and second series circuits are connected in parallel, the first series circuit being formed of first and second diodes and the second series circuit being formed of a third diode connected with the collector-emitter circuit of a transistor. The base electrode of the transistor is connected to the junction defined by the first and second diodes such that the base-emitter circuit thereof is in parallel arrangement with the second diode. A current source is connected to the parallel-connected series circuits so as to supply currents thereto. An input signal is supplied to the junction defined by the first and second diodes; the first and second outputs are coupled to this junction and to the collector electrode of the transistor, respectively, for providing differential output signal currents that are a function of the supplied signal. This circuit can be connected to a differential amplifier to supply differential signals to the latter, whereby a gain controlled amplification of the original single-ended input signal can be attained.

16 Claims, 6 Drawing Figures

CIRCUIT FOR CONVERTING SINGLE-ENDED INPUT SIGNALS TO A PAIR OF DIFFERENTIAL OUTPUT SIGNALS

BACKGROUND OF THE INVENTION

This invention relates to an improved circuit for converting a single-ended input signal to a double-ended, or differential output signal.

There are various uses of double-ended, or differential, signals. For example, in gain controlling applications wherein it is preferred to use differential amplifiers, the operation of such differential amplifiers is enhanced if the signal supplied thereto is a differential signal. Typically, the original input signal which is to be utilized by that differential amplifier is a single-ended signal. Hence, it often is necessary to convert the single-ended signal to a differential output signal, that is, to a pair of output signals which change by equal but opposite amounts as the single-ended input signal changes.

When supplying a single-ended input signal to a differential amplifier of the type formed of a pair of differentially-connected transistors, the input signal is applied to the base of one of the differentially-connected transistors while the base of the other transistor is AC coupled to ground. The collectors of these transistors provide a pair of differential output signals. Generally, however, in this simple configuration, a resistive bias circuit is necessary to provide proper bias voltages to the differentially-connected transistors. As a consequence of this resistive bias circuit, the overall circuit construction is relatively complicated. Moreover, the power supply voltage, or operating potential, which normally is supplied to the transistors also must be used to derive the necessary bias voltages. This is an inefficient use of the operating potential supply.

One type of circuit which has been proposed for converting a single-ended input signal to a pair of differential output signals is formed of a pair of diodes connected in one series circuit which, in turn, is connected in parallel with another series circuit, the latter being constituted by the base-emitter path of a transistor and another diode. In the absence of any signal current supplied to this circuit, and assuming that a current source is provided to supply a constant current to the parallel-connected circuits, equal currents flow through the series-connected diodes and also through the collector-emitter circuit of the transistor and the additional diode which is connected to the emitter of that transistor. If the emitter region and the equivalent emitter regions of the diodes all are of equal areas, and if another transistor has its base-emitter path connected in parallel with the additional diode, then the currents through both transistors, in the absence of a signal current, are equal. If a signal current is supplied to the additional diode, that is, if an input signal is supplied to the junction formed by the connection of the emitter of the first transistor and the additional diode, then the currents through both transistors will change by an amount equal but opposite to each other only if the supplied signal current is much less than the quiescent current supplied by the current source. That is, if the signal current is represented as $i_s$, then the currents through the two transistors can be represented as $I_o+i_s/2$ and $I_o-i_s/2$, wherein $I_o$ is the quiescent current supplied by the current source. Unfortunately, the requirement that the quiescent current must be much greater than the signal current means that either the current source must be very large, that is, must be capable of supplying a high current, or the signal current must be limited to be a very low value. Furthermore, if this relationship between the quiescent and signal currents is not maintained, significant distortion is introduced into the output currents which flow through the transistors. Consequently, this proposed circuit is not fully satisfactory.

Another proposed circuit for converting a single-ended input signal to a pair of differential output signals is described in U.S. Pat. No. 4,049,977. This disclosed circuit is formed of two series circuits connected in parallel, the first series circuit being formed of a pair of diodes, and the second series circuit being formed of an additional diode in series with the collector-emitter circuit of a transistor. The base of the transistor is, in turn, connected to the junction formed by the two diodes of the first series circuit. Output transistors have their base-emitter circuits connected in parallel with a respective diode in each of the series circuits. A current source supplies a quiescent current to the parallel circuits such that, in the absence of an input signal, the quiescent current $I_o$ flows through the first diode in each series circuit and, since the base-emitter voltage of each output transistor is equal to the voltage across each of the first diodes, the quiescent current $I_o$ also flows through the collector-emitter circuit of each output transistor. If an input signal is supplied to the second diode of the first series circuit, that is, if the input signal is supplied to the junction formed by the series diodes, then the output signal current through one output transistor increases by an amount which is equal to the decrease in the output signal current which flows through the other output transistor. More specifically, the output current through one of these transistors may be represented as $I_o+i_s/4$, while the output current through the other transistor may be represented as $I_o-i_s/4$. Although these differential output signal currents do not require the condition that the quiescent current $I_o$ be much greater than the signal current $i_s$, there is, nevertheless, the disadvantage that the input signal current is significantly attenuated by this circuit arrangement. That is, each of the differential output signal currents exhibits an amplitude that is only one-fourth the amplitude of the input signal current. Stated otherwise, the aforedescribed circuit arrangement exhibits a relatively poor current gain factor.

OBJECTS OF THE INVENTION

Therefore, it is an object of the present invention to provide an improved circuit for converting a single-ended input signal to a pair of differential output signals which overcomes the aforenoted disadvantages of previously proposed circuits.

Another object of this invention is to provide an improved conversion circuit having a far better current gain characteristic than described above.

An additional object of this invention is to provide a circuit for converting a single-ended input signal to a pair of differential output signals which is of relatively simple construction.

A further object of this invention is to provide a circuit for converting a single-ended input signal into a pair of differential output signals which exhibit minimal distortion.

Yet another object of this invention is to provide a conversion circuit which requires only a relatively low operating potential and, therefore, makes efficient use of an operating potential power supply.

Various other objects, advantages and features of the present invention will become readily apparent from the ensuing detailed description, and the novel features will be particularly pointed out in the appended claims.

SUMMARY OF THE INVENTION

In accordance with this invention, a circuit which is readily adapted to convert a single-ended input signal into a pair of differential output signals is provided with first and second series circuits connected in parallel, the first series circuit being formed of first and second diodes, and the second series circuit being formed of a third diode connected in series with the collector-emitter circuit of a transistor. The transistor has its base electrode connected to the junction defined by the diodes of the first series circuit such that the base-emitter circuit is in parallel arrangement with the second diode. A current source is coupled to the parallel-connected series circuits so as to supply currents thereto. An input signal current is supplied to the junction defined by the diodes of the first series circuit; and first and second outputs are coupled to this junction and to the collector electrode of the transistor, respectively, for providing differential output signal currents which are a function of the supplied signal current. These differential output signal currents may be supplied to a differential amplifier having a controllable gain.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
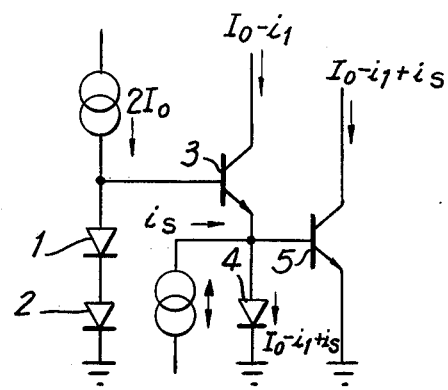
FIG. 1 is a schematic diagram of one proposal for a circuit to convert a single-ended input signal into a pair of differential output signals.

Before describing an embodiment of the present invention, reference is made to FIG. 1 which is a schematic diagram of a previous proposal for a circuit adapted to convert a single-ended input signal to a pair of differential output signals. This circuit is comprised of a pair of diodes 1 and 2 connected in series, this series circuit being connected in parallel with another series circuit formed of the base-emitter circuit of a transistor 3 and an additional diode 4. A current source capable of generating a substantially constant current is connected to these parallel-connected series circuits and, more particularly, is connected to the junction defined by the anode of diode 1 and the base electrode of transistor 3. For the purpose of the present description, a "current source" is understood to mean a current generating circuit whose output current remains substantially constant regardless of variations in the load to which this current is supplied. Of course, the current level produced by the current source is determined by various parameters and, if desired, may be controlled by a suitable control signal, adjustable circuit element, or the like. A typical current source is comprised of the collector-emitter circuit of a biased transistor. Other current source circuits are known, and another example is shown in aforementioned U.S. Pat. No. 4,049,977.

In the circuit of FIG. 1, diode 4 also is connected in parallel with the base-emitter circuit of another transistor 5. Although not shown herein, it is appreciated that a suitable source of operating potential is provided in order to energize the current source and also to supply operating voltages to transistors 3 and 5.

In operation, let it be assumed that the current source supplies a constant current, also referred to herein as the quiescent current, of value $2I_o$. Let it be further assumed that the emitter region of transistors 3 and 5 are of equal area; and that the equivalent emitter regions of diodes 1, 2 and 4 also are of this same equal area. Consequently, the voltage drop across each diode, as well as the base-emitter voltage drop across each transistor, is equal and may be represented as $V_{be}$. Additionally, the base-emitter impedance of each transistor and the diode impedance of each diode all are equal.

In the absence of an input signal, the current supplied by the current source is divided equally between the two series circuits which are connected thereto. Hence, a current $I_o$ flows through diodes 1 and 2, and an equal current $I_o$ flows through the collector-emitter circuit of transistor 3 and through diode 4. It is assumed that the base current of transistor 3 is negligible and, therefore, may be ignored. As may be appreciated, since the base-emitter voltage of transistor 3 is equal to the voltage across diode 4, the emitter current of the transistor is equal to the current which flows through the diode. In view of the negligible base current of transistor 3, the collector current thereof is equal to its emitter current. Hence, the collector-emitter current of transistor 3 is equal to the diode current of diode 4, which also is equal to the current flowing through diodes 1 and 2. It is therefore seen that this collective-emitter current is equal to $I_o$.

Now, let it be assumed that a signal is supplied to the junction defined by the emitter electrode of transistor 3 and diode 4. This signal is represented in FIG. 1 as a current source supplying a signal $i_s$. If this signal current results in an increase in the emitter voltage of transistor 3, then the collector-emitter current therethrough is reduced so as to be equal to $I_o - i_1$. By using Kirchoff's law, the current through diode 4 is equal to $I_o - i_1 + i_s$. Now, the voltage across diode 4 is equal to the base-emitter voltage of transistor 5. Hence, the emitter current of this transistor is equal to the current through diode 4. If it is assumed that the base current of transistor 5 is negligible and, thus, may be ignored, then the collector current through this transistor is equal to the emitter current thereof which, in turn, is equal to the current through diode 4. Hence, the collector current of transistor 5 is equal to $I_o - i_1 + i_s$.

The forward voltage drop across diode 1 is represented as $V_{be1}$; and forward voltage drop across diode 2 is represented as $V_{be2}$; the base-emitter voltage across transistor 3 is represented as $V_{be3}$; and the forward voltage drop across diode 4 is represented as $V_{be4}$. From FIG. 1, it is seen that $(V_{be1}+V_{be2})=(V_{be3}+V_{be4})$. From basic semiconductor theory, it is known that the current through a semiconductor diode is an exponential function of the forward voltage drop thereacross. Stated otherwise, the forward voltage drop $V_{be}$ of each diode, or the base-emitter voltage of transistor 3, may be represented as: $V_{be}=kT/q \ln I/I_s$, wherein k is the Boltzmann constant, T is absolute temperature in °Kelvin, q is the charge of an electron, I is the current through the diode or transistor, and $I_S$ is the reverse saturation current. Therefore, the following equation may be derived:

$$(V_{be1} + V_{be2}) = (V_{be3} + V_{be4}) \quad (1)$$

$$\frac{kT}{q}\left(\ln\frac{I_o}{I_s} + \ln\frac{I_o}{I_s}\right) = \frac{kT}{q}\left(\ln\frac{I_o - i}{I_s} + \ln\frac{I_o - i_1 + i_s}{I_s}\right)$$

Equation (1) can be solved for current $I_o$, resulting in $$I_o^2 = (I_o - i_1)(I_o - i_1 + i_s) \quad (2)$$

From equation (2), the current $i_1$ is found to be:

$$i_1 = \frac{2I_o + i_s - \sqrt{4I_o^2 + i_s^2}}{2} \quad (3)$$

If the quiescent current $I_o$ is much greater than the signal current $i_s$, equation (3) may be simplified, resulting in the approximation that $i_1 = i_s/2$. This means that the collector current of transistor, 3 is found to be $I_o - i_1 = I_o - i_s/2$; and the collector current of transistor 5 is found to be $I_o - i_1 + i_s = I_o + i_s/2$.

From the foregoing, it is seen that the collector currents of transistors 3 and 5 form a pair of differential output signal currents, wherein the collector current of transistor 5 exceeds the quiescent current $I_o$ and the collector current of transistor 3 is less than this quiescent current by the same amounts. That is, the signal currents through transistors 3 and 5 are equal but opposite to each other. However, these differential output signal currents are distorted if the requisite condition $I_o >> i_s$ is not maintained. To reduce this problem, it would be necessary to provide a current source which generates a very high quiescent current $I_o$. If the circuit shown in FIG. 1 is to be constructed as an integrated circuit, such a current source may not be practicable. Alternatively, for the foregoing condition to be maintained, the signal current $i_s$ must be limited to a very low value, which generally is undesirable.

Figure 2:
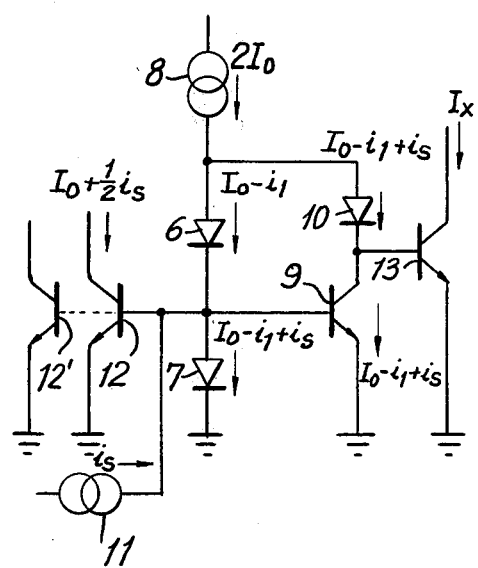
FIG. 2 is a schematic diagram of one embodiment of the present invention.

Turning now to FIG. 2, there is illustrated one embodiment of the present invention. The circuit illustrated in FIG. 2 is comprised of a first series circuit, formed of diodes 6 and 7, connected in parallel arrangement with a second series circuit, the latter being formed of a diode 10 and the collector-emitter circuit of a transistor 9. The base-emitter circuit of transistor 9 is connected in parallel with diode 7. A current source 8 is connected to the anodes of diodes 6 and 10 to supply a quiescent current to the parallel-connected series circuits. Diodes 6 and 7 are poled in the forward direction such that current flows through diode 6 and then through diode 7; and diode 10 is similarly poled such that current flows through diode 10 and then through the collector-emitter circuit of transistor 9. Current source 8 may be of the type described hereinabove with respect to FIG. 1.

The junction defined by diodes 6 and 7, that is, the junction which is formed between the cathode of diode 6 and the anode of diode 7, in addition to being connected to the base electrode of transistor 9, also is connected to the base electrode of an output transistor 12. If desired, other output transistors, represented as additional transistor 12', may have their base-emitter circuits connected in parallel with the base-emitter circuit of transistor 12. Referring only to a single output transistor 12, it is seen that the base-emitter circuit thereof is connected in parallel with diode 7.

Another output transistor 13 has its base electrode connected to the collector electrode of transistor 9 and its emitter electrode connected in common with the emitter electrode of transistor 9.

It is recognized by one of ordinary skill in the art that, if desired, diodes 6, 7 and 10 may be formed as diode-connected transistors in which the base and collector electrodes thereof are connected in common. Furthermore, it is intended that the illustrated circuit be constructed as an integrated circuit. Although not shown herein, it is to be understood that a power supply is provided in order to supply operating potential to the transistors and also to current source 8.

Let it be assumed that the emitter areas of transistors 9, 12 (and 12') and 13, as well as the equivalent emitter areas of diodes 6, 7 and 10, all are equal. Let it be further assumed that the circuit is constructed as an integrated circuit on a common semiconductor chip. Now, in the absence of an input signal thereto, the current provided by current source 8 divides equally between the parallel-connected series circuit. Thus, the current to diodes 6 and 7 is equal to $I_o$; and the current through diode 10 and the collector-emitter circuit of transistor 9 also is equal to $I_o$. If an input signal is supplied as an input signal current $i_s$ to the junction defined by diodes 6 and 7 (this input signal current being represented as an input signal current source 11), then the current through diode 6 may be reduced to a level equal to $I_o - i_1$. By Kirchoff's law, the current through diode 7 is equal to $I_o - i_1 + i_s$. The base-emitter voltage of transistor 9 is equal to the forward voltage drop across diode 7. Consequently, the emitter current of transistor 9 is equal to the forward diode current of diode 7, or $I_o - i_1 + i_s$. If it is correctly assumed that the base current of transistor 13 is negligible so as to be ignored, then the current through diode 10 is equal to the emitter current of transistor 9, this diode current also being represented as $I_o - i_1 + i_s$. The collector current through transistor 13 is to be determined, and this collector current is represented herein as $I_x$.

Since the base-emitter circuit of transistor 12 is connected in parallel with the base-emitter circuit of transistor 9, the emitter current of transistor 12 is equal to the emitter current of transistor 9. Assuming that the base current of transistor 12 is negligible and, thus, may be ignored, the collector current of transistor 12 is equal to the collector current of transistor 9, and may be represented as $I_o - i_1 + i_s$.

The sum of the currents supplied to the anodes of diodes 6 and 10 must be equal to $2I_o$, the current supplied thereto by current source 8. Thus, the following expressions may be found:

$$(I_o - i_1) + (I_o - i_1 + i_s) = 2I_o \quad (4)$$

$$i_1 = \tfrac{1}{2} i_s \quad (5)$$

From equation (5) it is seen that the collector current of transistor 12, which is equal to the current through diode 7, may be represented as $I_o + i_s/2$.

Diode 10 and the base-emitter circuit of transistor 13 form a series circuit which is in parallel arrangement with series-connected diodes 6 and 7. Let it be assumed that the forward diode voltage is equal to $V_{be}$, and the base-emitter voltage of transistor 13 also is represented as $V_{be}$. Thus, from FIG. 2, it is appreciated that $(V_{be6} + V_{be7}) = (V_{be10} + V_{be13})$. If the analysis used to derive equation (1) is used, then the currents through diodes 6 and 7 and the currents through diode 10 and transistor 13 are related as follows:

$$(I_o + \tfrac{1}{2} i_s)(I_o - \tfrac{1}{2} i_s) = (I_o + \tfrac{1}{2} i_s) I_x \quad (6)$$

$$I_x = I_o - \tfrac{1}{2} i_s \quad (7)$$

From the foregoing analysis, it is seen that the collector current $I_x$ of transistor 13 and the collector current of transistor 12 are differential output currents. That is, these collector currents vary by equal but opposite amounts in response to the input signal current $i_s$. Moreover, the effective current gain is satisfactory in that the differential output currents vary by $\tfrac{1}{2} i_s$ in response to the input signal current $i_s$. This is a significant improvement over the conversion circuit described in U.S. Pat. No. 4,049,977, mentioned above, wherein the differential output currents vary by a factor of $\tfrac{1}{4} i_s$ in response to the input signal current $i_s$.

From FIG. 2 and the foregoing description, it is appreciated that the differential output signal currents are derived from the junction defined by diodes 6 and 7 and the junction defined by diode 10 and transistor 9. This circuit configuration differs from that described in the aforementioned patent wherein the differential output signal currents are derived from output transistors which are connected across the upper diodes.

The present invention, as shown in FIG. 2, also is an improvement over the proposal described with respect to FIG. 1 in that, in accordance with the FIG. 2 embodiment, the condition that $I_o >> i_s$ need not be maintained. That is, distortion is not introduced into the differential output signal currents of the present invention and, therefore, it is not necessary that current source 8 generate a constant current of very high magnitude.

One advantage of the embodiment shown in FIG. 2, as compared to employing a differential amplifier to convert a single-ended input signal into a differential output signal, is that the present invention does not require a resistive bias circuit. Furthermore, the embodiment shown in FIG. 2 exhibits a relatively simple circuit configuration, and is capable of efficiently utilizing a power supply such that, as is desired, only relatively low operating potentials are needed.

As yet another advantage, even if multiple output transistors 12' are connected to transistor 12, or multiple output transistors (not shown) are connected in parallel with transistor 13, the amplitudes of the output differential signal currents are not substantially attenuated as a result of such multiple output transistors. Consequently, many pairs of differential output signals can be produced, thereby enabling several output circuits to be driven thereby. That is, multiple pairs of differential output signal currents can be derived from a single single-ended input signal.

As will be described below, the embodiment shown in FIG. 2 can be used in conjunction with a differential amplifier so as to supply the differential output signal currents at the collectors of transistors 12 and 13 as input signals to the differential amplifier, in order to attain gain-controlled amplification. In order to best appreciate the use of the present invention with a gain-controlled differential amplifier, reference first is made to FIG. 3 in which an embodiment of a typical gain control differential amplifier is shown. This differential amplifier is comprised of a first pair of differentially-connected transistors 32 and 33 and a second pair of differentially-connected transistors 40 and 41. The emitter electrodes of transistors 32 and 33 are connected to a common junction via respective emitter resistors $R_E$ of equal resistance. A current source 35, which may be similar to the aforementioned current sources, is connected between this common junction and the reference potential, such as ground. The base electrodes of transistors 32 and 33 are provided with bias voltages by a bias source 31. The collector electrode of transistor 32 is coupled to a source of operating potential $+V_{cc}$ via the collector-emitter circuit of a biased transistor 36; and the collector electrode of transistor 33 is similarly connected to the source of operating potential $+V_{cc}$ via the collector-emitter circuit of biased transistor 37. A source of bias potential 38 establishes a predetermined biased condition for each of transistors 36 and 37. In addition, the collector electrodes of transistors 32 and 33 also are connected to the base electrodes of differentially-connected transistors 40 and 41, respectively. The emitter electrodes of the latter transistors are connected in common to a current source 39. Finally, a load resistor $R_L$ is connected in the collector circuit of transistor 41; and an output terminal 42 is connected to this collector electrode.

Let it be assumed that an input voltage $V_i$, represented by voltage source 34, is AC-coupled to the base electrodes of transistors 32 and 33. The output voltage $v_o$ which is produced in response to this input voltage is provided at output terminal 42. If the current provided by current source 35 is represented as $2I_1$, then equal currents flow in the emitter circuits of transistors 32 and 33, each of these currents being represented as $I_1$. The collector currents of transistors 32 and 33 are substantially equal to the emitter currents thereof, thereby resulting in emitter currents $I_1$ flowing through the emitter circuits of transistors 36 and 37.

If the current generated by current source 39 is represented as $2I_2$, then equal currents flow through the emitter circuits of transistors 40 and 41, each of these currents being represented as $I_2$.

Input voltage $V_i$ is equal to the emitter resistance drop due to the emitter current $I_1$ of transistor 32, plus the voltage drop across resistor $R_E$, plus the voltage drop across resistor $R_E$ connected to the emitter electrode of transistor 33, plus the voltage drop due to the emitter current $I_1$ flowing through the emitter resistance of transistor 33. The output voltage $v_o$ is equal to the voltage drop across load resistor $R_L$ due to the current $I_2$ flowing through the collector-emitter circuit of transistor 41. These relationships may be expressed by the following equation:

$$V_o = \frac{R_L}{2(R_E + r_e)} \cdot \frac{I_2}{I_1} v_1 \quad (8)$$

wherein $r_e$ is the emitter resistance of each of transistors 32 and 33; and $r_e = kT/qI_1$.

Figure 3:
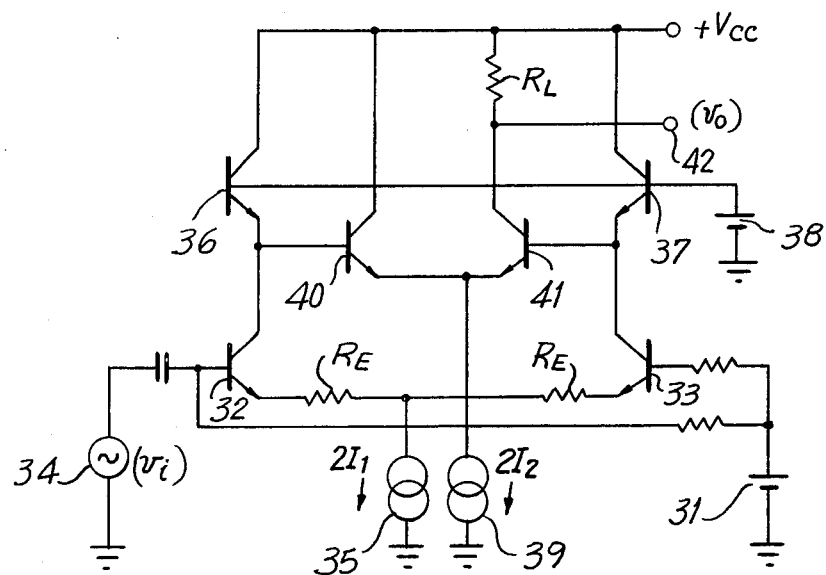
FIG. 3 is a schematic diagram of a differential amplifier which can be used as a gain control amplifier and which is of the type that is supplied with differential signals.

As can be seen from equation (8) gain control of output voltage $v_o$ is effected by varying either constant current $I_1$ or constant current $I_2$. That is, the gain of the differential amplifier circuit illustrated in FIG. 3 is determined by controlling either current source 35 or current source 39. In general, it is preferred not to vary current source 39, because such a variation results in changing the DC voltage at output terminal 42 due to the changed current $I_2$ flowing through load resistor $R_L$. Hence, in the FIG. 3 embodiment, gain control preferably is achieved by adjusting current source 35.

It is seen that the differential amplifier comprised of transistors 40 and 41 is supplied with differential input signals even though the original input voltage $v_i$ supplied to the illustrated circuit is a single-ended signal. In order to convert this single-ended input signal to the differential signals which are supplied to transistor 40 and 41, it is necessary to provide a first differential amplifier stage, formed of transistors 32 and 33, supplied with appropriate bias potentials by bias voltage source 31. The bias circuit which is used to apply the appropriate bias potentials to transistors 32 and 33 is a resistance voltage divider circuit. This resistive bias circuit adds additional complexity to the construction of the integrated circuit and, moreover, makes relatively inefficient use of the power supply which must be employed to provide the bias voltage source 31. In order to maintain a wide dynamic range for the gain controlled amplifier shown in FIG. 3, the power supply voltage must be relatively high. As yet another disadvantage associated with this illustrated gain controlled amplifier, it is appreciated from equation (8) that a desirably high gain is attained if constant current $I_1$ is relatively low. However, the emitter resistance $r_e$ of each of transistors 32 and 33 will be relatively high if constant current $I_1$ exhibits a low magnitude. Consequently, and as is seen from equation (8), a high emitter resistance $r_e$ results in a low gain. Thus, it is difficult to achieve the desirable feature of high gain at low constant current $I_1$.

Figure 4:
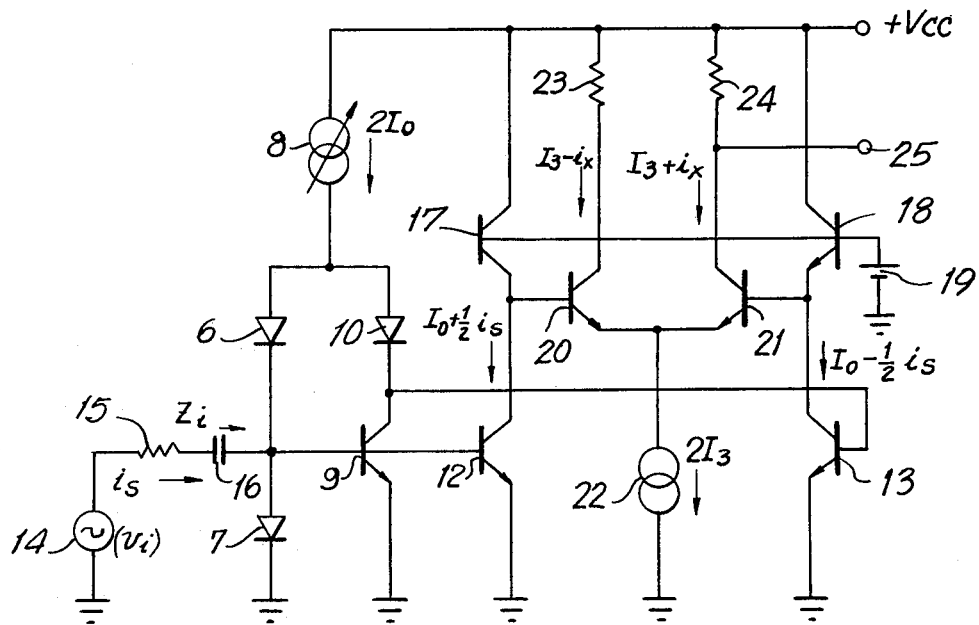
FIG. 4 is a schematic diagram of an embodiment of the present invention used in conjunction with a differential amplifier.

The foregoing problems and disadvantages attending the gain-controlled amplifier circuit shown in FIG. 3 are avoided when the present invention is used in combination with, for example, a differential amplifier. Referring to FIG. 4, there is illustrated a schematic representation of the combination of the present invention, having the embodiment shown in FIG. 2, with a simple differential amplifier. More particularly, the embodiment of the present invention is comprised of parallel-connected series circuits, one of which is formed of diodes 6 and 7 and the other of which is formed of diode 10 and the collector-emitter circuit of transistor 9, with the base electrode of the latter connected to the junction defined by diodes 6 and 7. Output transistor 12 has its base-emitter circuit connected in parallel with the base-emitter circuit of transistor 9; and output transistor 13 has its base-emitter circuit connected in parallel with the collector-emitter circuit of transistor 9. It is recalled from the foregoing explanation that, if a single-ended input signal is supplied to the junction formed by the cathode of diode 6 and the anode of diode 7, differential output currents will flow through the collector-emitter circuits of output transistors 12 and 13.

The differential amplifier which is connected to the conversion circuit of the present invention is comprised of differentially-connected transistors 20 and 21 whose emitter electrodes are connected in common to a current source 22. The base electrodes of transistors 20 and 21 are respectively connected to the collector electrodes of output transistors 12 and 13 of the conversion circuit. In addition, transistors 17 and 18 have their collector-emitter circuits connected in series with the collector electrodes of transistors 12 and 13, respectively. The base electrodes of transistors 17 and 18 are connected in common to a bias voltage source 19 such that these transistors serve as load impedances for the output transistors. An operating potential is supplied from a source $+V_{cc}$ to current source 8, to the collector electrodes of load transistors 17 and 18, and through collector resistors 23 and 24 to the collector electrodes of differentially-connected transistors 20 and 21.

Let it be assumed that an input voltage $V_i$ is supplied by a suitable voltage source 14 via an input resistor 15 to the input terminal (i.e., to the junction defined by diodes 6 and 7) of the illustrated circuit. Although a capacitor 16 also is shown, this capacitor may be omitted, if desired. As is known, an input signal current $i_s$ flows through resistor 15 as a function of the input voltage $v_i$ divided by the resistance of resistor 15 and the input impedance $z_i$ of the illustrated circuit. This input impedance is the impedance which is present at the input terminal (i.e., at the junction of diodes 6 and 7).

From the explanation set out hereinabove with respect to FIG. 2, it is recalled that if an input signal current $i_s$ is supplied to the input terminal, the collector currents of transistors 12 and 13 may be represented as $I_o + i_s/2$ and $I_o - i_s/2$, respectively. Let it be assumed that if the collector current of transistor 12 increases, the conductivity of transistor 20 is reduced and the conductivity of transistor 21 is increased. If the current generated by current source 22 is represented as $2I_3$, then the collector current of transistor 20 may be represented as $I_3 - i_x$, and the collector current of transistor 21 may be represented as $I_3 + i_x$. Now, if the base-emitter voltage of each of transistors 17, 18, 20 and 21 is represented as $V_{be}$ (with the appropriate numerical suffix to identify the corresponding transistor), then $(V_{be17} + V_{be20}) = (V_{be18} + V_{be21})$. It is recalled that this equation which relates base-emitter voltage results in the following equation which relates the collector currents of the respective transistors:

$$(I_o + \tfrac{1}{2}i_s)(I_3 - i_x) = (I_o - \tfrac{1}{2}i_s)(I_3 + i_x) \quad (9)$$

Equation (9) may be solved for the output signal current $i_x$, resulting in:

$$i_x = I_3/2I_o i_s \quad (10)$$

Let it now be assumed that the resistance of resistor 24 is represented as R24, and the output signal voltage $v_o$ (i.e., the AC component) is provided at the collector electrode of transistor 21. Consequently, the output signal voltage $v_o$ is equal to the product of the resistance of resistor 24 and the signal current $i_x$ flowing therethrough. This means that, from equation (10), the output signal voltage $v_o$ may be expressed as:

$$v_o = R_{24} \cdot i_x = (R_{24} \cdot I_3)/2I_o \cdot i_s \quad (11)$$

As is known, the input impedance $Z_i$ is equal to the change in the voltage at the input terminal (i.e., at the junction defined by diodes 6 and 7) relative to the change in the input signal current. The voltage at the input terminal is equal to the voltage across diode 7 which, of course, is equal to the base-emitter voltage of transistor 9. It is recalled that the base-emitter voltage of a transistor may be expressed as a function of the $$\ln \frac{\text{emitter current}}{\text{reverse saturation current}}.$$

Thus, the input impedance $Z_i$ may be expressed as:

$$Z_i = \frac{\partial V}{\partial i_s} = \frac{\partial}{\partial i_s}\left(\frac{kT}{q}\ln\frac{I_o + \frac{i}{2}i_s}{I_s}\right) \quad (12)$$

$$= \frac{kT}{q} \cdot \frac{1}{\alpha I_s} \cdot \frac{I_s}{I_o + \frac{1}{2}i_s} \quad (13a)$$

$$= \frac{kT}{q} \cdot \frac{1}{2(I_o + \frac{1}{2}i_s)} \quad (13)$$

If the constant current $I_o$ generated by current source 8 is much greater than the input signal current $i_s$, then equation (13) may be simplified to:

$$Z_i = \frac{1}{2}\frac{kT}{qI_o} = \frac{r_e}{2} \quad (14)$$

Let it be assumed that the resistance of resistor 15 is represented as $R_{15}$. The input signal current $i_s$ is equal to the input voltage $v_i$ divided by the sum of the resistance of resistor 15 and the input impedance $Z_i$. Thus, the input signal current $i_s$ may be expressed as follows:

$$i_s = \frac{v_i}{R_{15} + \frac{r_e}{2}} \quad (15)$$

If equation (15) is substituted in equation (11), then the output signal voltage $v_o$, derived at output terminal 25, may be expressed as:

$$v_o = \frac{R_{24}}{2\left(R_{15} + \frac{r_e}{2}\right)} \cdot \frac{I_3}{I_o} \cdot v_i \quad (16)$$

It is apparent from equation (16) that gain control, that is, the gain in the output signal voltage $v_o$, may be achieved by varying one or the other or both of current sources 8 and 22, so as to correspondingly vary the constant currents $I_o$ and $I_3$. Controllable current sources are, of course, known and may be used to implement current sources 8 and/or 22.

From FIG. 4, it is seen that the single-ended input signal is converted to a pair of differential output signals by the conversion circuit shown in FIG. 2 and not by a differential amplifier, as shown in FIG. 3. Hence, a source of bias voltage, similar to bias voltage source 31 (FIG. 3), and a bias voltage network (similar to the voltage-divider bias resistors of FIG. 3) are not needed. This simplifies the circuit construction and, moreover, enables a relatively low cost, simple power supply to be used. The latter feature is attributed to the fact that, in the embodiment shown in FIG. 4, the power supply is used efficiently. That is, a high operating voltage is not needed in order to provide a bias voltage similar to bias voltage source 31 (FIG. 3). Even though the operating voltage $+V_{cc}$ thus may be maintained at a relatively low level, proper gain control nevertheless can be carried out. Additionally, since the differential amplifier of FIG. 4 is supplied with differential current signals, the gain-controlled amplifier exhibits a desirably wide dynamic range and has good frequency characteristics.

The gain-determining equations (8) and (16) associated with the circuits shown in FIGS. 3 and 4, respectively, are similar. It is important to note, however, that the denominator in equation (8) contains the parameter $r_e$; whereas the denominator of equation (16) contains the parameter $r_e/2$. That is, the gain of the amplifier shown in FIG. 3 is affected by the emitter resistance $r_e$ of transistors 32 and 33; whereas the gain of the amplifier shown in FIG. 4 is affected by one-half this resistance. Consequently, the deleterious influence on gain control by the emitter resistance $r_e$ when constant current $I_o$ is decreased is markedly reduced when the present invention is used. As yet another advantage associated with the embodiment shown in FIG. 4, current sources 8 and 22 may be of simplified construction such as, for example, each may be formed of a resistor having relatively high resistance.

Figure 5:
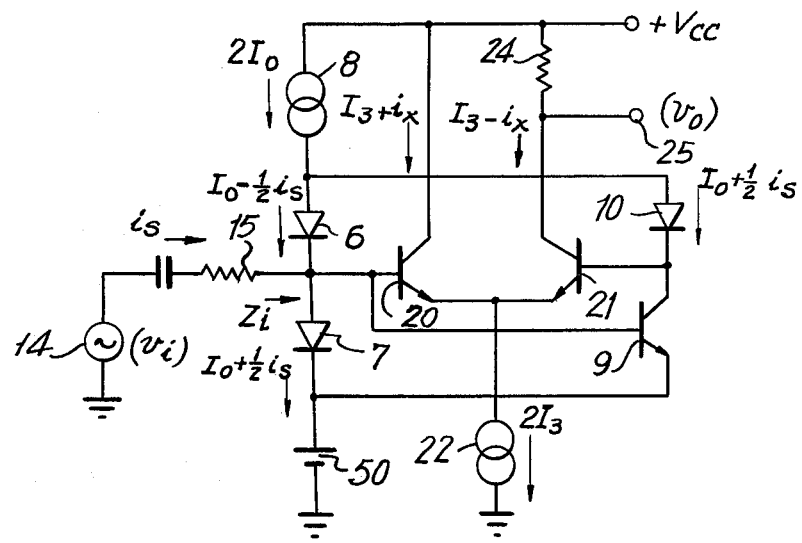
FIG. 5 is a schematic diagram of another embodiment of the present invention used with a differential amplifier.

Another embodiment of a gain-controlled amplifier used with the conversion circuit of the present invention is illustrated in FIG. 5. In this embodiment, output transistors 12 and 13 are omitted. Hence, the input terminals of the differential amplifier formed of transistors 20 and 21, that is, the base electrodes of these transistors, are connected respectively to the junction defined by diodes 6 and 7 and to the junction between diode 10 and the collector electrode of transistor 9. Furthermore, a bias voltage is provided at the common junction formed by the cathode of diode 7 and the emitter electrode of transistor 9, this bias voltage being represented by bias source 50. In the FIG. 5 embodiment, the collector electrode of transistor 20 is connected directly to the source of operating potential $+V_{cc}$, thereby omitting load resistor 23. Still further, the biased load transistors 17 and 18 of FIG. 4 are omitted from the embodiment shown in FIG. 5. Nevertheless, the function performed by these omitted biased load transistors is performed by diodes 6 and 10.

It is appreciated that the embodiment shown in FIG. 5 is of simpler construction than the embodiment of FIG. 4. Bias source 50 may be derived from the usual voltages which are used to bias the transistors that normally are provided in current sources 8 and 22. Alternatively, if current sources 8 and 22 are formed as resistors having high resistance, bias source 50 may be merely a forward-biased diode.

A mathematical analysis of the embodiment shown in FIG. 5 is substantially identical to the mathematical analysis of the embodiment shown in FIG. 4. Hence, the gain of the FIG. 5 embodiment may be expressed as equation (16).

Figure 6:
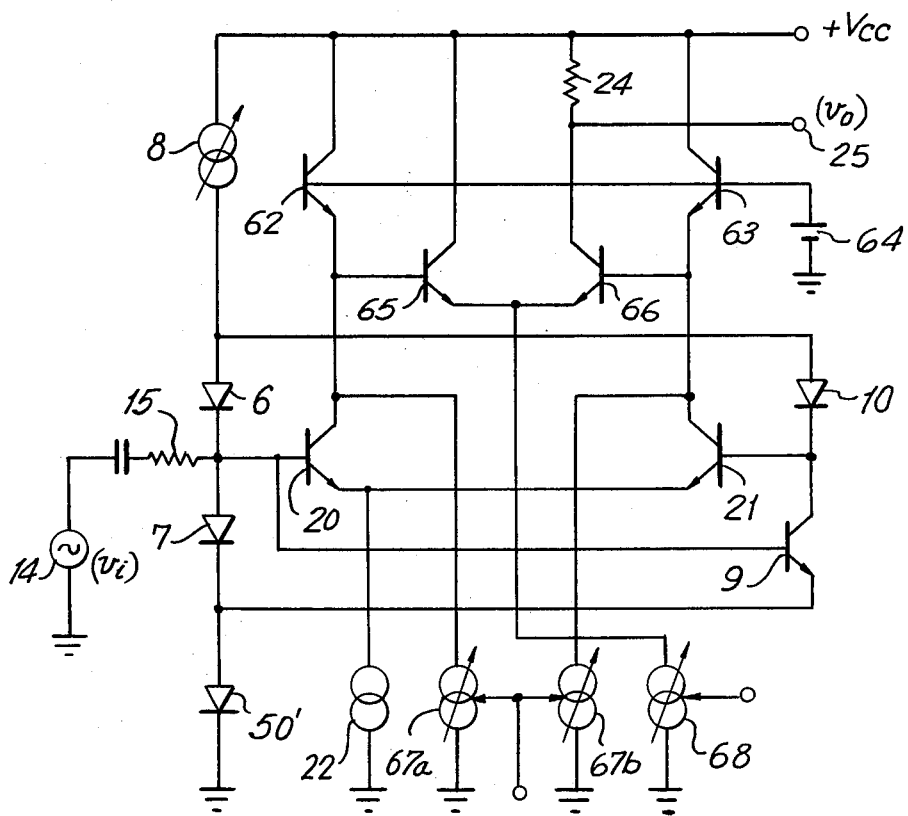
FIG. 6 is a schematic diagram of an embodiment of the present invention used in conjunction with a gain controlling amplifier which finds ready application as, for example, a color saturation control circuit in a color television receiver.

Turning now to FIG. 6, there is illustrated yet another embodiment of the combination of the conversion circuit of the present invention with a differential amplifier to provide a gain-controlled amplifier. The illustrated embodiment finds particular application in the chrominance channel of a color television receiver and is adapted to adjust the color saturation of the displayed video picture.

The embodiment of FIG. 6 is similar to that shown and described with reference to FIG. 5, with the addition that the differential amplifier formed of transistors 20 and 21 is used to supply differential signals to a further differential amplifier formed of transistors 65 and 66. These latter transistors have their emitter electrodes connected in common to a current source 68. This current source is illustrated as an adjustable current source responsive to a control signal supplied thereto so as to correspondingly vary the constant current generated thereby. In FIG. 6, resistor 24 is connected in the collector circuit of transistor 66, and output terminal 25 is connected to this collector electrode.

Biased load transistors 62 and 63, similar to aforedescribed biased load transistors 17 and 18, are connected in the collector circuits of transistors 20 and 21, respectively. A bias source 64 supplies a predetermined bias voltage to the base electrodes of these biased load transistors. Operating potential $+V_{cc}$ is supplied to current source 8, to the collector electrodes of biased load transistors 62 and 63, to the collector electrode of transistor 65 and, via resistor 24, to the collector electrode of transistor 66.

A forward-biased diode 50' is used in the embodiment shown in FIG. 6 as the bias source 50 (of FIG. 5).

Let it be assumed that the input voltage $v_i$, supplied by a suitable source 14, is the chrominance signal voltage. Let it be further assumed that current source 8 is a controlled current source responsive to an automatic chrominance control (ACC) signal to vary the constant current $I_o$ supplied thereby. Thus, the amplitude of the chrominance signal currents through the collector-emitter circuits of transistors 20 and 21 are controlled as a function of the ACC signal which is used to adjust current source 8.

The collector electrodes of transistors 20 and 21 are connected, in addition to the base electrodes of transistors 65 and 66, to current sources 67a and 67b, respectively. These current sources may be of conventional construction and responsive to a control signal to adjust the current amplitude generated thereby.

If the circuit shown in FIG. 6 is analyzed, it will be found that the mathematical equation representing the gain thereof is similar to equation (16), except that the term $I_3$ is replaced by a current that is a function of the current generated by current sources 22 and 68; and current $I_o$ is a function of the currents generated by current sources 8, 22 and 67a or 67b. Thus, the gain of the embodiment shown in FIG. 6 can be adjusted as a function of the ACC signal supplied to current source 8, or as a function of the control signals which determine the currents generated by current sources 67a, 67b and 68. Color saturation control, that is, control of the quality of the video picture which is produced by the color television receiver in which the embodiment shown in FIG. 6 is used, thus can be effected merely by controlling current sources 67a and 67b, or by controlling current source 68. If the currents generated by current sources 67a and 67b are increased, the overall gain of the illustrated embodiment is reduced. If the current generated by current source 68 is increased, the overall gain of the illustrated circuit is increased.

While the present invention has been shown and described with reference to various preferred embodiments, it should be readily apparent to those of ordinary skill in the art that various changes and modifications in form and details may be made without departing from the spirit and scope of the invention. For example, the diodes used in the various embodiments may be formed as diode-connected transistors. The transistor devices may be of any suitable type which are operable in the aforedescribed manner. Preferably, the illustrated embodiments of the present invention are constructed as integrated circuits. It is intended that the appended claims be interpreted as including these as well as other such changes and modifications.

What is claimed is:

1. A circuit for converting a single-ended input signal to a pair of differential output signals, comprised of first and second diode means connected in a first series circuit; third diode means; transistor means having its collector-emitter circuit connected in a second series circuit with said third diode means, the first series circuit formed of said first and second diode means being connected in parallel with the second series circuit formed of said third diode means and the collector-emitter circuit of said transistor means; said transistor means having its base electrode connected to the junction defined by said first and second diode means such that the base-emitter circuit thereof is in parallel arrangement with said second diode means; current source means connected to the parallel-connected first and second series circuits so as to supply currents thereto; means for supplying a signal current to said junction defined by said first and second diode means; and first and second output means coupled to said junction defined by said first and second diode means and to the collector electrode of said transistor means, respectively, for providing a pair of differential output signal currents to flow therethrough that are a function of said supplied signal current.

2. The circuit of claim 1 wherein said differential output signal currents are equal and opposite to each other.

3. The circuit of claim 1 wherein said first and second output means comprise first and second output transistors, respectively, said first output transistor having its base-emitter circuit connected in parallel with said second diode means and said second output transistor having its base electrode connected to the collector electrode of said transistor means and its emitter electrode connected to the emitter electrode of said transistor means, said pair of differential output signal currents flowing as collector currents in said first and second output transistors, respectively.

4. The circuit of claim 3 further comprising a differential amplifier having first and second inputs connected to the collector electrodes of said first and second output transistors, respectively.

5. The circuit of claim 4 wherein said differential amplifier comprises a pair of differentially-connected transistors whose base electrodes are connected to the collector electrodes of said first and second output transistors, respectively, and whose emitter electrodes are connected to a common junction; second current source means connected to said common junction; a pair of bias transistors whose collector-emitter circuits are respectively connected to the base electrodes of said differentially-connected transistors to supply bias currents thereto said respective collector-emitter circuits being further connected in series with the respective collector-emitter circuits of said first and second output transistors; and at least one output terminal coupled to the collector electrode of at least one of said differentially-connected transistors to provide an output signal.

6. The circuit of claim 5 wherein at least one of said current source means is adjustable to vary the gain in the output signal provided by said circuit.

7. The circuit of claim 1 wherein said first and second output means comprise a pair of differentially-connected transistors whose base electrodes are connected to said junction defined by said first and second diode means and to said collector electrode of said transistor means, respectively, and whose emitter electrodes are connected in common, second current source means coupled to said common-connected emitter electrodes; and at least one output terminal coupled to the collector electrode of at least one of said differentially-connected transistors to provide an output signal.

8. The circuit of claim 7 further comprising a source of bias potential coupled in common to the emitter electrode of said transistor means and to said second diode means.

9. The circuit of claim 8 wherein at least one of said current source means is adjustable to vary the gain in the output signal provided by said circuit.

10. The circuit of claim 7, 8 or 9 comprising a pair of output terminals respectively coupled to the collector electrodes of said pair of differentially-connected transistors; a second pair of differentially-connected transistors having their base electrodes connected to respective ones of said output terminals and their emitter electrodes connected in common; third current source means coupled to said common-connected emitter electrodes of said second pair of differentially-connected tansistors; and a circuit output coupled to the collector electrode of one of said second pair of differentially-connected transistors.

11. The circuit of claim 10, further comprising a pair of bias transistors whose collector-emitter circuits are respectively connected in series with the collector-emitter circuits of the first-mentioned pair of differentially-connected transistors, the emitter electrodes of said pair of bias transistors being further respectively connected to the base electrodes of said second pair of differentially-connected transistors.

12. The circuit of claim 11 further comprising additional current source means respectively connected to the emitter electrodes of said pair of bias transistors.

13. A gain controlled amplifier circuit comprising first and second diode means connected in a first series circuit; third diode means, first transistor means having its collector-emitter circuit connected in a second series circuit with said third diode means, the first and second series circuits being in parallel with each other; said first transistor means having its base electrode connected to the junction defined by said first and second diode means such that the base-emitter circuit thereof is in parallel arrangement with said second diode means; first current source means connected to the parallel-connected first and second series circuits so as to supply currents thereto; means for supplying a single-ended signal to said junction defined by said first and second diode means; second transistor means having its base-emitter circuit connected in parallel with said second diode means; third transistor means having its base electrode connected to the collector electrode of said first transistor means and its emitter electrode connected to the emitter electrode of said first transistor means, a pair of differential output signal currents flowing through the collector-emitter circuits of said second and third transistor means; output differential amplifier means having a pair of differentially-connected transistors whose base electrodes are respectively connected to the collector electrodes of said second and third transistor means and whose emitter electrodes are connected in common; second current source means coupled to the common-connected emitter electrodes of said differentially-connected transistors; and at least one output terminal coupled to the collector electrode of at least one of said differentially-connected transistors to provide an output signal whose gain is controllable as a function of at least one of said current source means.

14. A gain-controlled amplifier circuit comprising first and second diode means connected in a first series circuit; third diode means; first transistor means having its collector-emitter circuit connected in a second series circuit with said third diode means, the first and second series circuits being in parallel with each other; said first transistor means having its base electrode connected to the junction defined by said first and second diode means such that the base-emitter circuit thereof is in parallel arrangement with said second diode means; first current source means coupled to the parallel-connected first and second series circuits so as to supply currents thereto; means for supplying a single-ended signal to said junction defined by said first and second diode means; first differential amplifier means having a first pair of differentially-connected transistors whose base electrodes are respectively connected to said junction defined by said first and second diode means and to the collector electrode of said first transistor means and whose emitter electrodes are connected in common, a pair of differential output signal currents flowing through the collector-emitter circuits of said first pair of differentially-connected transistors, respectively; second current source means coupled to the common-connected emitter electrodes of said first pair of differentially-connected transistors; output differential amplifier means having a second pair of differentially-connected transistors whose base electrodes are respectively connected to the collector electrodes of said first pair of differentially-connected transistors and whose emitter electrodes are connected in common; third current source means coupled to the common-connected emitter electrodes of said second pair of differentially-connected transistors; and at least one output terminal coupled to the collector electrode of at least one of the second pair of differentially-connected transistors to provide an output signal whose gain is controllable as a function of at least one of said current source means.

15. The circuit of claim 13 or 14 further comprising a pair of bias transistors whose emitter electrodes are respectively coupled to the base electrodes of the differentially-connected transistors in said output differential amplifier means to apply bias voltages thereto.

16. A gain-controlled amplifier circuit comprising first and second diode means connected in a first series circuit; third diode means; first transistor means having its collector-emitter circuit connected in a second series circuit with said third diode means, the first and second series circuits being in parallel with each other; said first transistor means having its base electrode connected to the junction defined by said first and second diode means such that the base-emitter circuit thereof is in parallel arrangement with said second diode means; first current source means connected to the parallel-connected first and second series circuits so as to supply currents thereto; means for supplying a single-ended signal to said junction defined by said first and second diode means; bias means coupled to said parallel-connected first and second series circuits to apply a bias voltage thereto; differential amplifier means having a pair of differentially-connected transistors whose base electrodes are respectively connected to said junction defined by said first and second diode means and to the collector electrode of said first transistor means and whose emitter electrodes are connected in common, a pair of differential output signal currents flowing through the collector-emitter circuits of said pair of differentially-connected transistors, respectively; second current source means coupled to the common-connected emitter electrodes of said pair of differentially-connected transistors; and at least one output terminal coupled to the collector electrode of at least one of said pair of differentially-connected transistors to provide an output signal whose gain is controllable as a function of at least one of said current source means.

* * * * *